United States Patent
Ahlers et al.

(10) Patent No.: US 9,978,672 B1
(45) Date of Patent: May 22, 2018

(54) TRANSISTOR PACKAGE WITH TERMINALS COUPLED VIA CHIP CARRIER

(71) Applicant: Infineon Technologies AG, Neubiberg (DE)

(72) Inventors: Dirk Ahlers, München (DE); Gilles Delarozee, Grünwald (DE); Daniel Schleisser, München (DE); Christopher Spielman, Redford, MI (US); Thomas Stoek, Buxtehude (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/603,476

(22) Filed: May 24, 2017

(51) Int. Cl.
| | |
|---|---|
| *H01L 23/495* | (2006.01) |
| *H01L 21/00* | (2006.01) |
| *H01L 23/52* | (2006.01) |
| *H02M 7/5387* | (2007.01) |
| *H02M 1/084* | (2006.01) |
| *H01L 23/31* | (2006.01) |
| *H01L 21/48* | (2006.01) |

(52) U.S. Cl.
CPC .... *H01L 23/49575* (2013.01); *H01L 21/4825* (2013.01); *H01L 23/3114* (2013.01); *H01L 23/4952* (2013.01); *H01L 23/49503* (2013.01); *H01L 23/49562* (2013.01); *H02M 1/084* (2013.01); *H02M 7/53871* (2013.01); *B60Y 2200/91* (2013.01)

(58) Field of Classification Search
CPC ......... H01L 23/49503; H01L 23/49541; H01L 21/561; H01L 23/495; H01L 23/59542; H01L 23/49575; H01L 2924/14; H01L 23/49562; H01L 23/49524; H01L 23/4952; H01L 21/4825; H01L 7/53871; H02M 7/53871

See application file for complete search history.

(56) References Cited

U.S. PATENT DOCUMENTS

| 7,173,333 | B2 * | 2/2007 | Hata ................. H01L 23/49562 257/183 |
| 7,880,280 | B2 | 2/2011 | Otremba |
| 8,390,041 | B2 * | 3/2013 | Yoshimochi ........ H01L 23/3107 257/288 |
| 2003/0067065 | A1 | 4/2003 | Lee et al. |
| 2003/0075783 | A1 | 4/2003 | Yoshihara et al. |

(Continued)

FOREIGN PATENT DOCUMENTS

DE    10144671 A1    4/2003

*Primary Examiner* — Jasmine Clark

(57) ABSTRACT

A package comprising an at least partially electrically conductive chip carrier, a first transistor chip comprising a first connection terminal, a second connection terminal and a control terminal, and a second transistor chip comprising a first connection terminal, a second connection terminal and a control terminal, wherein the first transistor chip and the second transistor chip are connected to form a half bridge, and wherein the second connection terminal of the first transistor chip is electrically coupled with the first connection terminal of the second transistor chip by a bar section of the chip carrier extending between an exterior edge region of the first transistor chip and an exterior edge region of the second transistor chip and maintaining a gap laterally spacing the first transistor chip with regard to the second transistor chip.

23 Claims, 7 Drawing Sheets

(56) References Cited

U.S. PATENT DOCUMENTS

| | | |
|---|---|---|
| 2004/0004272 A1 | 1/2004 | Luo et al. |
| 2005/0133902 A1 | 6/2005 | Pavier et al. |
| 2010/0065950 A1 | 3/2010 | Lowry et al. |
| 2016/0247751 A1 | 8/2016 | Kinzer |

* cited by examiner

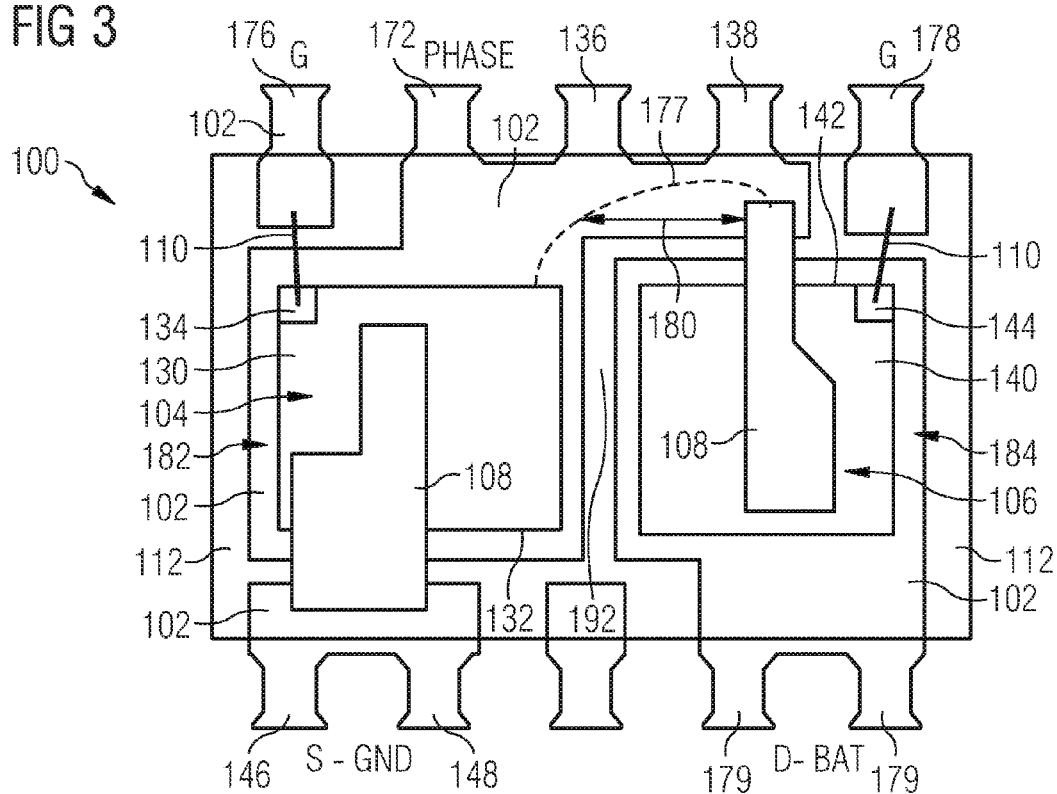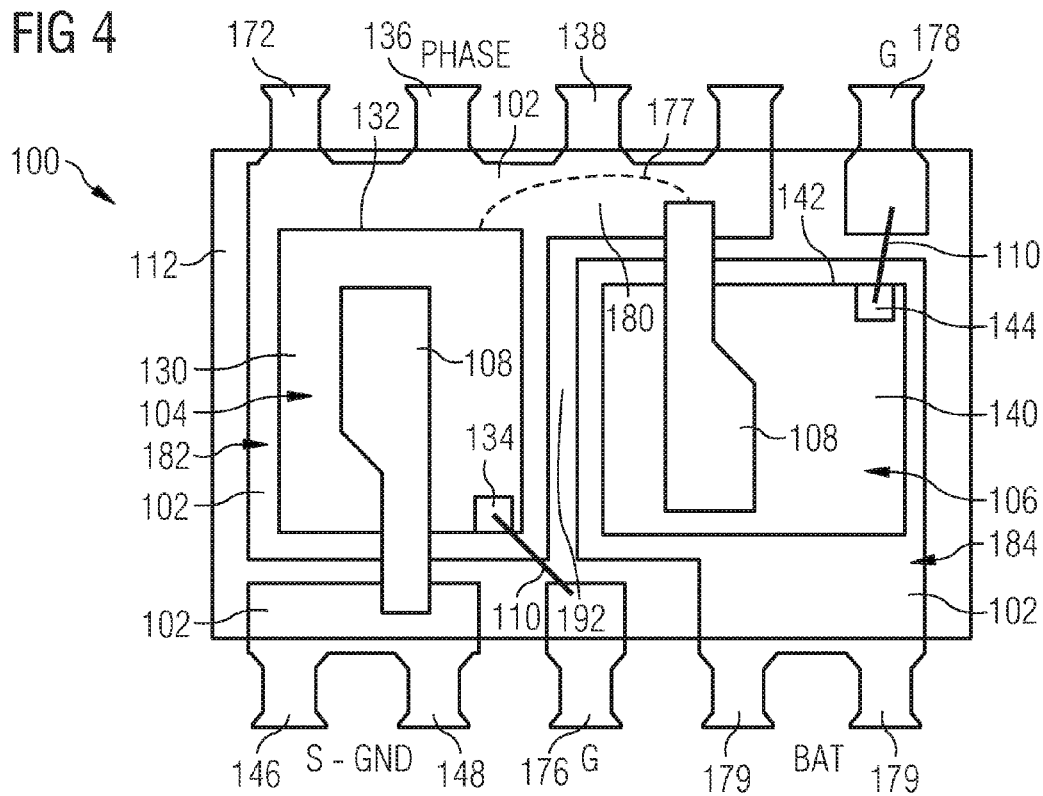

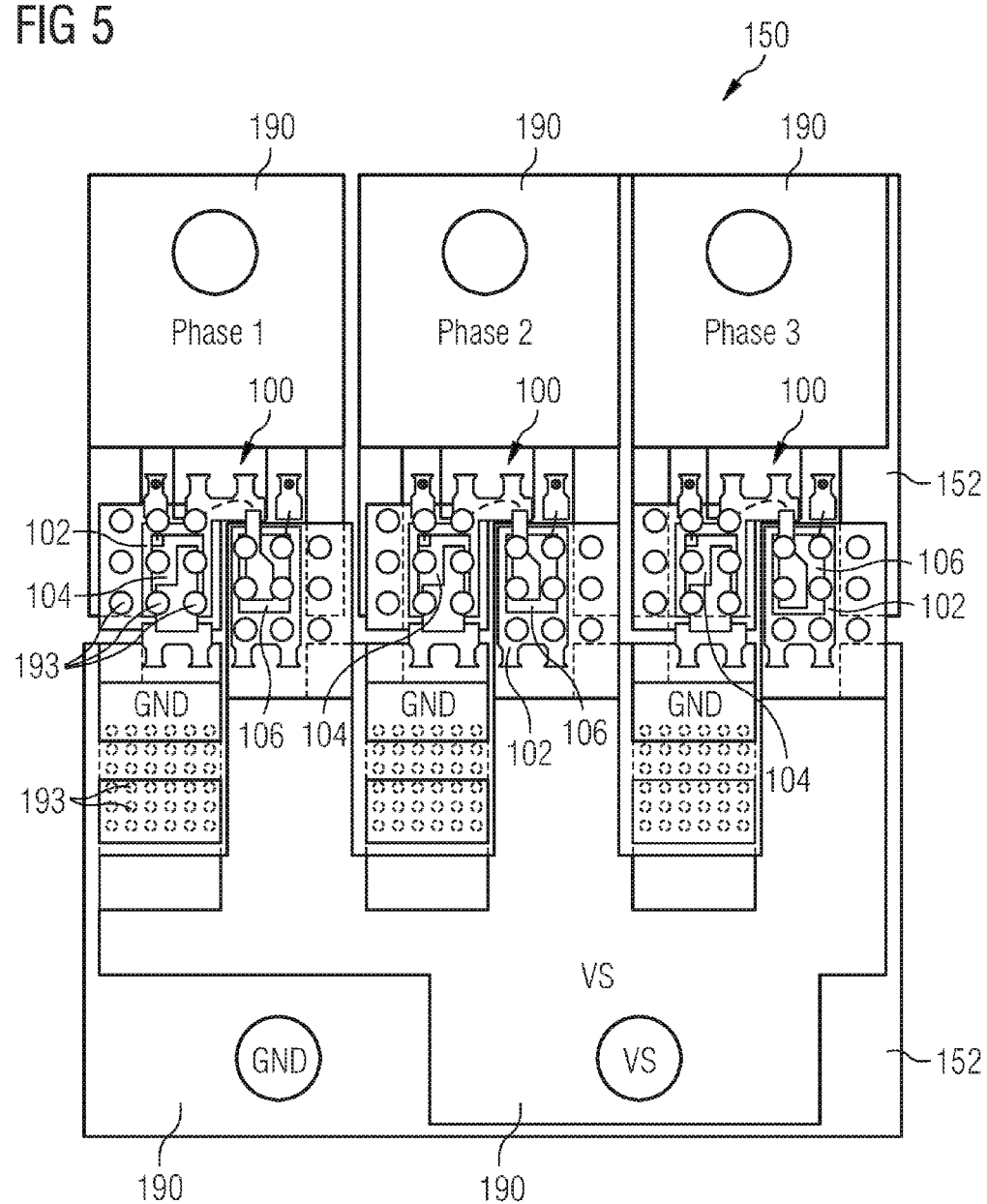

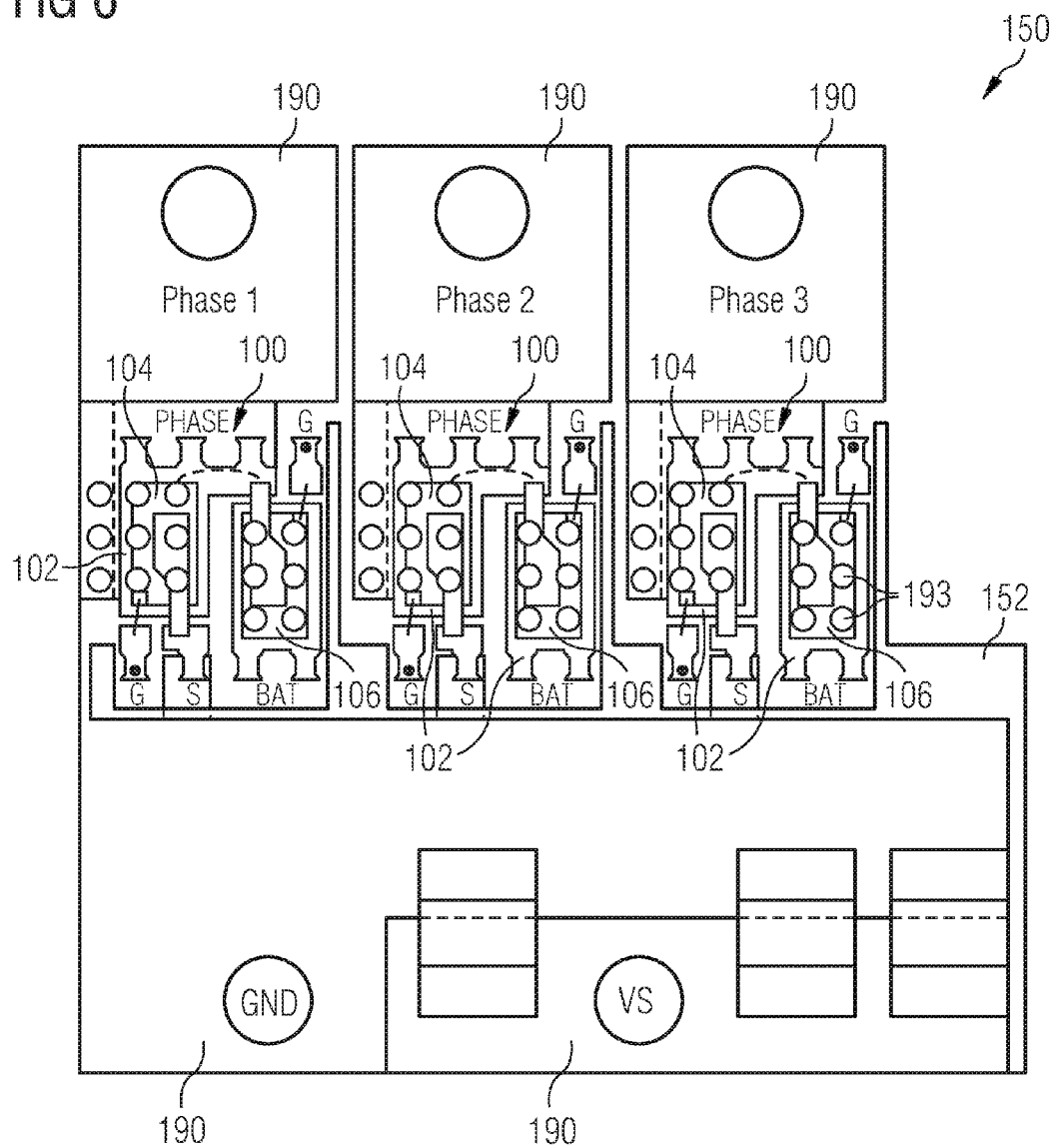

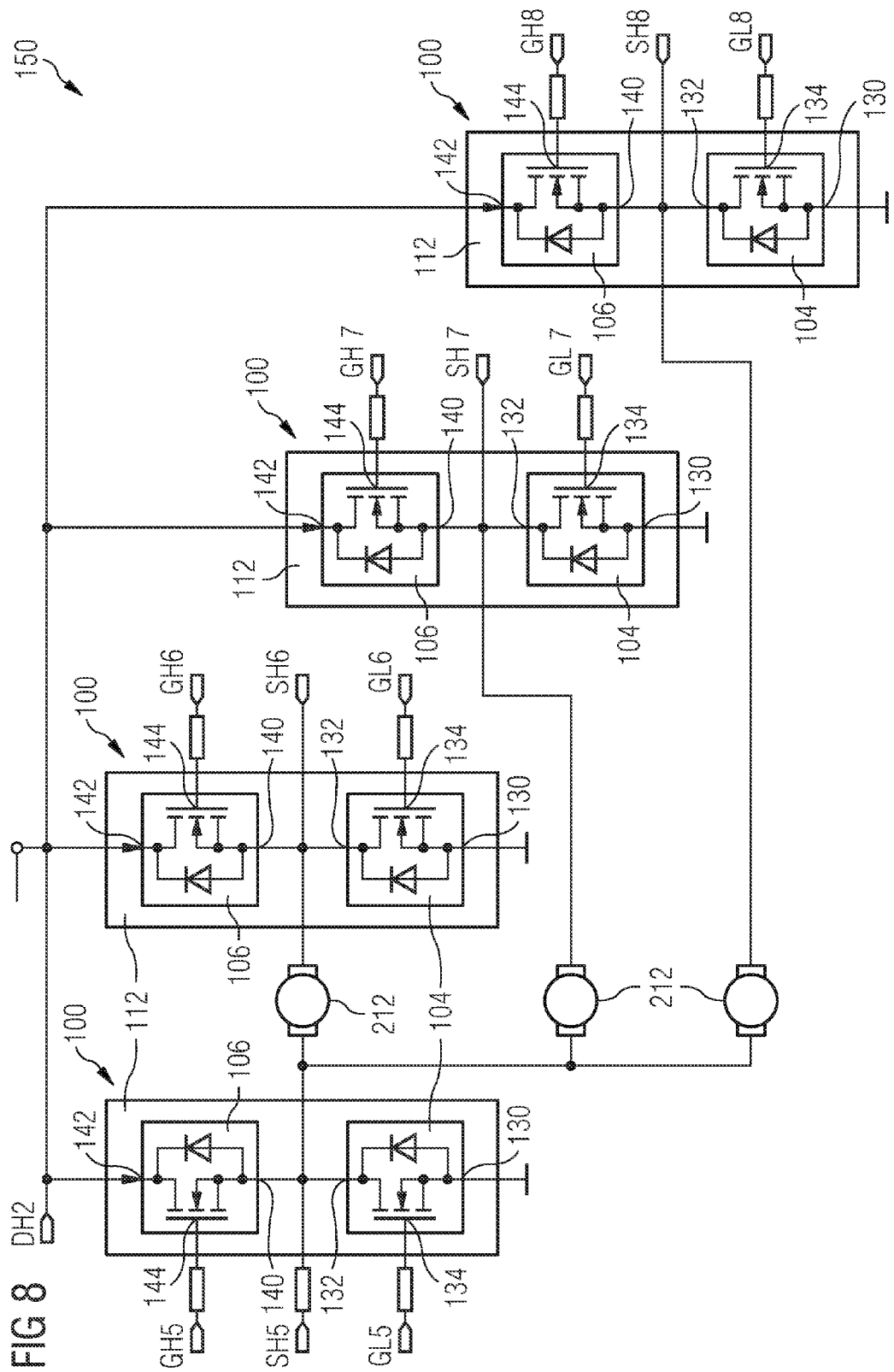

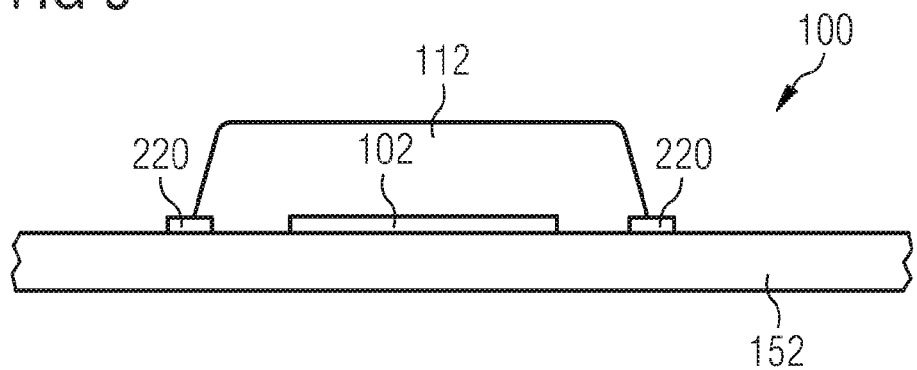
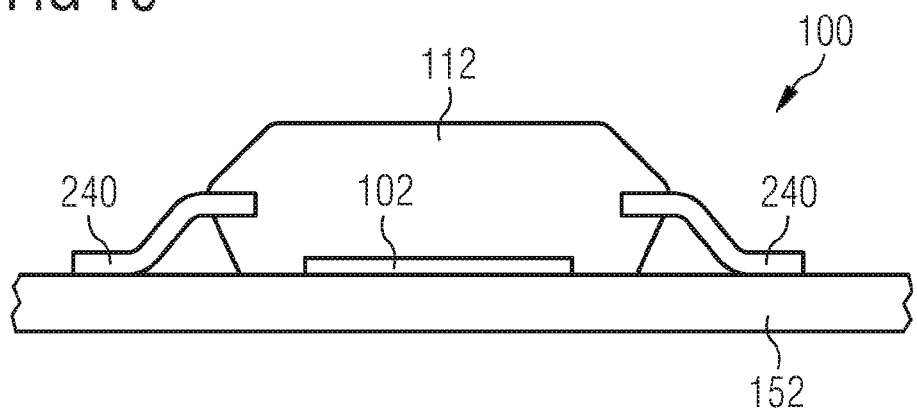
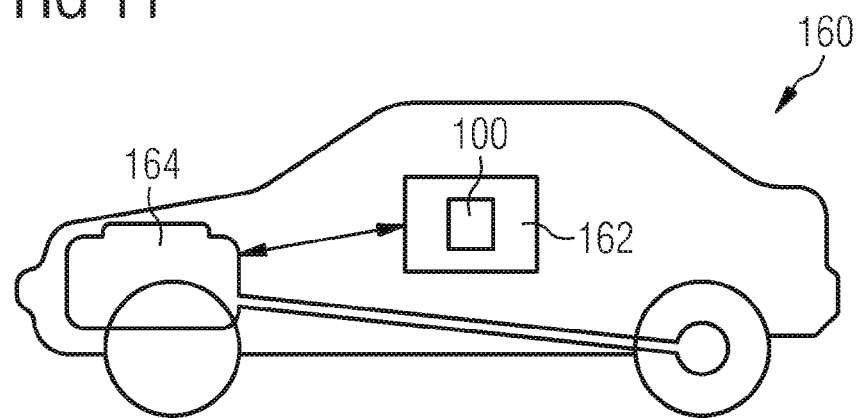

TRANSISTOR PACKAGE WITH TERMINALS COUPLED VIA CHIP CARRIER

BACKGROUND OF THE INVENTION

Field of the invention

The present invention relates to packages, an electronic device, a method of use, and manufacturing methods.

Description of the related art

A package, for instance for automotive applications, provides a physical containment for one or more electronic chips comprising one or more integrated circuit elements. Examples of integrated circuit elements of packages are a field effect transistor, an insulated-gate bipolar transistor (IGBT), and a diode.

There is still potentially room to simplify manufacturability of a package while efficiently reducing space consumption and keeping current paths short.

SUMMARY OF THE INVENTION

There may be a need for a transistor or integrated circuit package with efficient layout.

According to an exemplary embodiment, a package is provided which comprises an at least partially electrically conductive chip carrier, a first transistor chip comprising a first connection terminal, a second connection terminal and a control terminal, and a second transistor chip comprising a first connection terminal, a second connection terminal and a control terminal, wherein the first transistor chip and the second transistor chip are connected to form a half bridge, and wherein the second connection terminal of the first transistor chip is electrically coupled with the first connection terminal of the second transistor chip by a bar section of the chip carrier extending between an exterior edge region of the first transistor chip and an exterior edge region of the second transistor chip and maintaining a gap laterally spacing the first transistor chip with regard to the second transistor chip.

According to another exemplary embodiment, a package is provided which comprises a leadframe-type chip carrier, a first field effect transistor chip comprising a source terminal, a drain terminal and a gate terminal, and a second field effect transistor chip comprising a source terminal, a drain terminal and a gate terminal, wherein the drain terminal of the first field effect transistor chip is electrically coupled with the source terminal of the second field effect transistor chip by the chip carrier so that an electrically insulating gap remains between the first field effect transistor chip and the second field effect transistor chip.

According to another exemplary embodiment, an electronic device is provided which comprises a plurality of electrically interconnected packages having the above-mentioned features.

According to still another exemplary embodiment, a method of manufacturing a package is provided, wherein the method comprises providing an at least partially electrically conductive chip carrier, mounting a first transistor chip on the chip carrier, the first transistor chip comprising a first connection terminal, a second connection terminal and a control terminal, mounting a second transistor chip on the chip carrier, the second transistor chip comprising a first connection terminal, a second connection terminal and a control terminal, connecting the first transistor chip and the second transistor chip to form a half bridge, and electrically coupling the second connection terminal of the first transistor chip with the first connection terminal of the second transistor chip by a bar section of the chip carrier extending between an exterior edge region of the first transistor chip and an exterior edge region of the second transistor chip and maintaining a gap laterally spacing the first transistor chip with regard to the second transistor chip.

According to yet another exemplary embodiment, a method of manufacturing a package is provided, wherein the method comprises providing a leadframe-type chip carrier, mounting a first field effect transistor chip on the chip carrier, the first field effect transistor comprising a source terminal, a drain terminal and a gate terminal, mounting a second field effect transistor chip on the chip carrier, the second field effect transistor comprising a source terminal, a drain terminal and a gate terminal, and electrically coupling the drain terminal of the first field effect transistor chip with the source terminal of the second field effect transistor chip by the chip carrier so that an electrically insulating gap remains between the first field effect transistor chip and the second field effect transistor chip.

According to yet another exemplary embodiment, a package having the above-mentioned features is used for an automotive application, in particular for controlling an electric motor in a vehicle.

According to an exemplary embodiment, a package is provided in which two transistor chips (which in particular may be field effect transistor chips) are interconnected on a (in particular leadframe-type) chip carrier so that a second connection terminal of one of the transistor chips is connected via the chip carrier (preferably via an exterior bar of the chip carrier) with a first connection terminal of the other transistor chip while maintaining a gap between the transistor chips. Such a design allows manufacturing with low technological effort and saves a considerable amount of space. In a more specific embodiment, a drain terminal of a first field effect transistor chip may be connected via the chip carrier with a source terminal of the other field effect transistor chip. By taking this measure, an advantageous layout in terms of space consumption and length of the current path of the package may be obtained. In other words, the fact that the second connection terminal of the first transistor chip and the first connection terminal of the second transistor chip may be quasi-directly coupled with one another via the chip carrier allows to keep the electric path between the two mentioned terminals short. This results in low loss of the half bridge type package and a small space requirement. As a result, a very simple package can be obtained which can be manufactured in a compact, cost-efficient and simple way. Complex current paths involving additional impedances can be avoided by such a circuit architecture.

DESCRIPTION OF FURTHER EXEMPLARY EMBODIMENTS

In the following, further exemplary embodiments of the packages, the electronic device, the method of use, and the manufacturing methods will be explained.

In the context of the present application, the term "transistor chip" may particularly denote an electronic chip which may be embodied in semiconductor technology and which may have at least one integrated transistor. The mentioned transistor may be a field effect transistor, an insulated gate bipolar transistor or another kind of bipolar transistor. It is possible that only the transistor is realized on the transistor chip as only integrated circuit element. It is however also possible that a diode (which can for instance be provided intrinsically by manufacturing a field effect transistor as such, or which may be manufactured separately from the transistor) forms part of the transistor chip. In yet another embodiment, at least one further active or passive integrated circuit element may be formed on a transistor chip.

In the context of the present application, the term "connection terminal" may particularly denote one of typically two terminals of a transistor along which a use signal may propagate during operation. In the example of a field effect transistor, the mentioned connection terminals are a source terminal and a drain terminal. In another transistor type, the two connection terminals may be emitter and collector.

In the context of the present application, the term "control terminal" may particularly denote a terminal of the transistor at which a control signal can be applied by which the characteristics of an electric signal propagating between the two connection terminals may be controlled, influenced, or enabled/disabled. In the example of a field effect transistor or an IGBT, the control terminal may be the gate terminal. In another bipolar transistor configuration, the control terminal may be the base terminal.

In the context of the present application, the term "half bridge" may particularly denote a circuit composed of an upper transistor switch ("high-side") and a lower transistor switch ("low-side"). For instance, the transistors may be MOSFETs, i.e. metal oxide semiconductor field effect transistors. The transistors may be connected in a cascode arrangement. The two transistor switches may be turned on and off complementary to each other (in particular with a non-overlapping dead-time) by applying corresponding voltage waveforms at each of the control terminals. A desired result may be a square-wave voltage at a mid-point that switches between a first electric potential (such as a DC bus voltage) and a second electric potential (such as ground). The two transistors may be interconnected with a mutual connection of their connection terminals so that a two transistor based switch with implemented diode characteristic may be obtained. The mentioned half bridge configuration may be used as such or alone, or may be combined with one or more further half bridges (or other electric circuits) to realize a more complex electric function. For instance, two such half bridges may form a full bridge.

In the context of the present application, the term "chip carrier" may particularly denote an at least partially electrically conductive structure which serves simultaneously as a mounting base for the transistor chips and also contributes to the electric interconnection between the transistor chips. In other words, the chip carrier may fulfil a mechanical support function and an electric connection function.

In an embodiment, the chip carrier is a leadframe. Such a leadframe may be a sheet-like metallic structure which can be patterned so as to form mounting sections for mounting the transistor chips, one or more bar sections for electric interconnection between terminals of the transistor chips, and pin sections for electric connection of the package to an electronic environment when the transistor chips are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of the transistor chips can be combined with a robust support capability of the leadframe. Furthermore, a leadframe may contribute to the thermal conductivity of the package and may remove heat generated during operation of the transistor chips as a result of the high thermal conductivity of the metallic (in particular copper) material of the leadframe.

In an embodiment, at least one of the first transistor chip and the second transistor chip is selected from a group consisting of a field effect transistor chip, and an insulated gate bipolar transistor chip. Both field effect transistor as well as insulated gate bipolar transistor configurations are compatible with a high switching performance and may render the package highly appropriate for robust and demanding applications such as automotive applications. However, also other transistor geometries are generally possible, for instance any other type of bipolar transistors.

In an embodiment, at least one of the first transistor chip and the second transistor chip is configured for operation with a vertical current flow (in particular a current flow perpendicular to a plane within which the chip carrier extends). Correspondingly, the source terminals and the gate terminals may for example be located on a surface of the field effect transistor chips facing away from the chip carrier, and the drain terminals may be located on a surface of the field effect transistor chips facing the chip carrier. Transistor chips being configured for a vertical current flow may have transistor terminals both at an upper main surface and a lower main surface, respectively, of the transistor chip. In particular in such a vertical flow configuration, the quasi-direct coupling between second connection terminal (in particular drain terminal) of the first transistor chip and first connection terminal (in particular source terminal) of the second transistor chip is highly advantageous and can be realized with extremely short current paths and thus with a very simple layout. When a corresponding transistor chip is mounted on a chip carrier, the one or more chip terminals at a lower main surface thereof can be directly mechanically and electrically connected with a mounting surface of the electrically conductive chip carrier. The one or more terminals on an opposing upper main surface of the respective transistor chip may then be electrically connected with the chip carrier by one or more connection elements such as clips or bond wires. Thereby, it is possible to guide a signal from a plane corresponding to an upper main surface of the transistor chips to a lower located plane of the chip carrier.

In an embodiment, the first transistor chip is configured as a low-side switch and the second transistor chip is configured as a high-side switch. The terms "low side" and "high side" transistor chips relate to the function of the respective transistor chip in the context of a half bridge application. More specifically, the drain terminal of a low side field effect transistor chip may be directly connected via the chip carrier with a source terminal of a high side field effect transistor chip.

In an embodiment, the second connection terminal of the first transistor chip corresponds to a first pin of the chip carrier which is located neighboured or next to a second pin of the chip carrier to which the first connection terminal of the second transistor chip corresponds. When the two mentioned pins of the chip carrier, which are assigned to the second connection terminal of the first transistor chip and the first connection terminal of the second transistor chip, are directly juxtaposed to one another or are located side by side without an additional pin in between, an extremely short current path between the two mentioned terminals of a half bridge configuration may be obtained. As a result, a very low ohmic configuration with high electric performance and a very compact configuration may be thereby obtained.

In an embodiment, the bar section extends between the first pin and the second pin. It is possible that the bar section extends substantially perpendicular to the extension of the first pin and the second pin. Thereby, it becomes possible to efficiently short-circuit the second connection terminal of the first transistor chip with the first connection terminal of the second transistor chip. The bar section may extend parallel to and along a direction along which the transistor chips are aligned. This provides a very short current path and thus a compact design. Space consuming connection elements horizontally bridging a gap between the transistor chips may become dispensable.

In an embodiment, the second connection terminal of the first transistor chip and the first connection terminal of the second transistor chip are located at different height levels of the package. As a result, the electric coupling between the second connection terminal of the first transistor chip and the first connection terminal of the second transistor chip may vertically bridge the height gap and may therefore extend partially along a vertical direction.

In an embodiment, the first transistor chip and the second transistor chip are arranged on two separate islands of the chip carrier. The electric connection between these two metallic islands can be accomplished reliably by one or more additional electric connection elements such as clips or bond wires.

In an embodiment, a gap between the first transistor chip and the second transistor chip is free of connection elements (and may optionally be also free of chip carrier material). As a result of the omission of electric connection elements bridging a horizontal inter-chip gap, very large chip areas are possible and a compact package can be produced.

In an embodiment, the control terminals (in particular gate terminals) are arranged facing away from the chip carrier. Thus, the control terminals may vertically protrude beyond the mounting surface of the chip carrier. More complicated designs, such as a flip-chip configuration or a source down architecture, may thereby be omitted.

In an embodiment, two of the connection terminals (in particular source terminals) are arranged facing away from the chip carrier and the other two of the connection terminals (in particular drain terminals) are arranged facing the chip carrier.

In an embodiment, at least one of the second connection terminal of the first transistor chip and the second connection terminal of the second transistor chip is directly electrically connected to the chip carrier. In other words, each of the at least one mentioned connection terminal may be connected to the chip carrier without additional electrical circuitry in between. For example, the mentioned chip terminals may be directly soldered or sintered or glued on the chip carrier. This keeps the entire package small and the current paths short.

In an embodiment, at least one of the first connection terminal of the first transistor chip, the control terminal of the first transistor chip, the first connection terminal of the second transistor chip, and the control terminal of the second transistor chip is electrically connected to the chip carrier indirectly via an electric connection element. When a part of the chip terminals is directly bonded on the chip carrier, and when the mentioned transistor chips are vertical current flow components, the remaining other chip terminals are located in a plane which is vertically displaced or spaced with regard to the mounting plane of the chip carrier. In such a scenario, the implementation of one or more connection elements for guiding electric signals back from an elevated plane on a top main surface of the transistor chips to the mounting plane of the chip carrier are advantageous.

In an embodiment, a respective electric connection element is configured to electrically connect a respective terminal at a top side of one of the transistor chips with a respectively other terminal at a bottom side of the same or the other one of the transistor chips, and/or with a pin of the chip carrier. Such an embodiment is advantageous in a configuration of the package with vertical flow transistor chips which, in turn, are a preferred choice for high power semiconductor applications.

In an embodiment, the electric connection element comprises one of the group consisting of a clip, a bond wire, and a bond ribbon. A clip may be a three-dimensionally bent plate type connection element which has two planar sections to be connected to an upper main surface of the respective transistor chip and an upper main surface of the chip carrier, wherein the two mentioned planar sections are interconnected by a slanted connection section. As an alternative to such a clip, it is possible to use a bond wire or bond ribbon which is a flexible electrically conductive wire or ribbon shaped body having one end portion connected to the upper main surface of the respective transistor chip and having an opposing other end portion being electrically connected to the chip carrier.

In an embodiment, the first transistor chip and the second transistor chip are substantially identical semiconductor chips. When the two transistor chips of the half bridge type package are identical in shape, dimension and electric performance, it is sufficient to provide only one type of transistor chip for manufacturing the package. This keeps the effort low. In an alternative embodiment, it is however possible that the two transistor chips have different sizes and electric performance, for instance to take into account different duty cycles of the transistor chips.

In an embodiment, the package comprises an encapsulant partially encapsulating the chip carrier, and at least partially encapsulating the first transistor chip and the second transistor chip. The mentioned encapsulant may provide for a mechanical protection and an electric isolation of the encapsulated transistor chips and the encapsulated portion of the chip carrier. For example, it is possible that the encapsulant is embodied as a single encapsulation body which covers all of the mentioned elements. Alternatively, it is possible to provide separate encapsulation bodies for the different transistor chips.

In an embodiment, the encapsulant is selected from a group consisting of a mold compound, and a laminate. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant.

In an embodiment, the package is configured as one of the group consisting of a leaded package, and a leadless package. A leadless package is for instance shown in FIG. 9. A leadless package comprises substantially no leads extending out of the chip carrier beyond the encapsulant. In contrast to this, a leaded package (see FIG. 10) comprises leads of the chip carrier which extend beyond the encapsulant and being for instance shaped with a gull wing type geometry.

The described circuit architecture with the two transistor chips connected to form a half bridge with the two mentioned connection terminals being coupled with one another via the chip carrier can be realized with many different package types. More specifically, various different package architectures are compatible with the described connection architecture with compact layout and short electric paths. For instance, a PQFN package type is compatible with the described connection technology, as well as an HSOF package technology. Therefore, the mentioned layout design can be easily adapted to various different package technologies.

In an embodiment, at least one of the source terminals is assigned to at least two pins of the chip carrier. Such a configuration in which a source terminal of one of the transistor chips is connected to multiple assigned pins allows to increase the current carrying capability of the package. Therefore, the described configuration is highly advantageous in particular for high power applications.

In an embodiment, the transistor chips are configured as power semiconductor chips. Thus, the transistor chips (such as semiconductor chips) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In embodiments, the transistor chips may form a circuit functioning as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the power module or package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the module or package according to an exemplary embodiment is fully compatible with standard packaging concepts (in particular fully compatible with standard TO packaging concepts), which is highly user-convenient. In an embodiment, the package is configured as power module, for instance a molded power module.

As substrate or wafer forming the basis of the transistor chip(s) or electronic chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:
FIG. 1 to FIG. 4 show cross-sectional views of packages according to exemplary embodiments.
FIG. 5 and FIG. 6 shows cross-sectional views of electronic devices comprising multiple packages according to exemplary embodiments, assembled on a board.
FIG. 8 shows a circuit diagram of an electronic device configured as cascaded multiple motor control comprising multiple packages according to an exemplary embodiment.
FIG. 9 shows a cross-sectional view of a leadless package according to an exemplary embodiment.
FIG. 10 shows a cross-sectional view of a leaded package according to an exemplary embodiment.
FIG. 11 illustrates schematically a vehicle comprising a power package according to an exemplary embodiment.

DETAILED DESCRIPTION OF EXEMPLARY EMBODIMENTS

Figure 1:
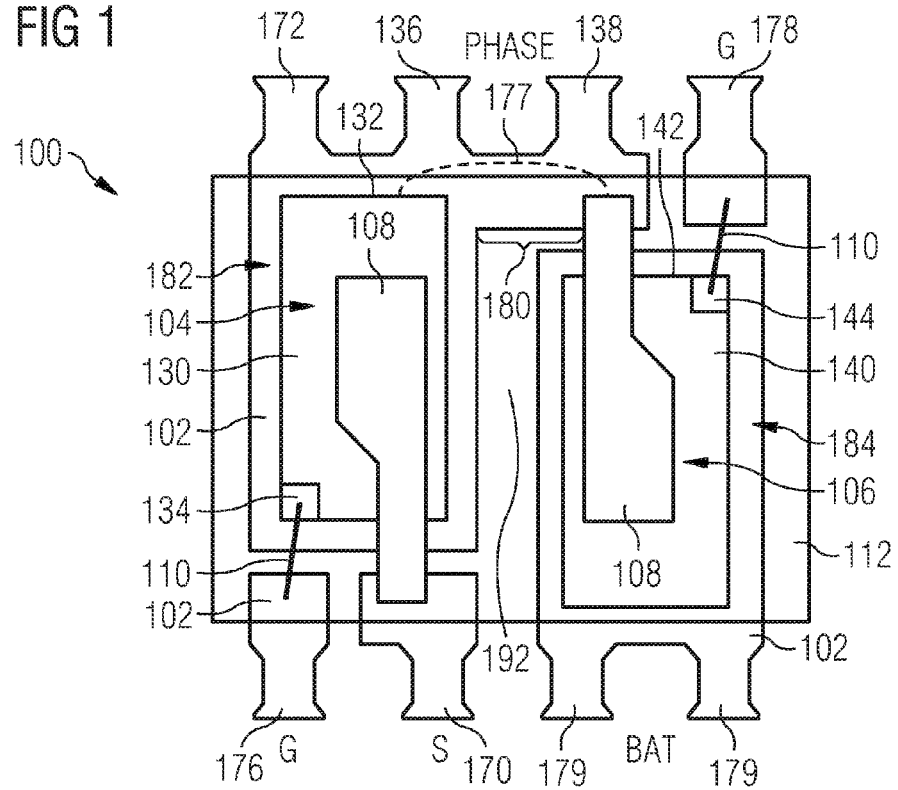

The illustration in the drawing is schematically.

Before describing further exemplary embodiments in further detail, some basic considerations of the present invention will be summarized based on which exemplary embodiments have been developed.

More and more motors in a car are converted to the so called brushless DC topology. This topology simplifies the motor construction but increases the electronic control effort. This effort however also pays off in form of improved motor precision and efficiency.

A conventional challenge is to find a cost and space efficient solution for half bridge transistors (such as MOSFETs) for the above and other electronic applications.

Conventionally, a half bridge is typically designed by using two discrete MOSFETs. This offers high flexibility in board design and for the sourcing of the MOS. However, in very cost sensitive applications discrete MOS may not be the cheapest solution since the package cost are dominating. Also in applications that use more than the typical number of three phases (fail save electronic steering for example), discrete MOS may be not a proper solution since the number of required MOSFETs can easily exceed twelve or more.

Conventional dual MOS packages are no real option for the described applications, since the wiring on board level cannot be rendered efficient in terms of low stray inductances which are advantageous for high efficiency.

In view of the foregoing, an exemplary embodiment provides a configuration of transistor chips (in particular MOSFET chips) within a package. In this context, a chip carrier (in particular a leadframe) may be designed such that three current carrying pins are arranged in a way that allows an advantageous board layout. A gist of an exemplary embodiment is that the half bridge is formed by a specific leadframe design. An advantage of such a design is its simplicity. The wafer technology does not need to be changed, for instance the same technology as in conventional clip packages can be used. Also modifications on package level may be covered in principle by a corresponding chip carrier (in particular leadframe) design. Hence, exemplary embodiments offer design and efficiency improvements on system level supporting miniaturization.

An advantageous feature of exemplary embodiments is a specific leadframe design supporting an efficient board adapted half bridge design. A corresponding design keeps the electronic paths between the transistor chips and the chip carrier short, thereby improving the electric performance. At the same time, this designs makes it possible to obtain a compact configuration of the package.

In the following description of exemplary embodiments referring to the figures, field effect transistors are implemented as first transistor chip 104 and second transistor chip 106. Therefore, these transistor chips 104, 106 will be denoted in the following as field effect transistor chips 104, 106. However, it will be understood by a skilled person that all embodiments described in the following can also be implemented with other transistor types (such as an insulated gate bipolar transistor). In other words, the mentioned field effect transistor chips 104, 106 can also be realized as transistor chips of different technology. Correspondingly, the first connection terminals 130, 140 will be denoted in the following as source terminals 130, 140, and the second connection terminals 132, 142 will be denoted as drain terminals 132, 142. Accordingly, the control terminals 134, 144 will be denoted in the following as gate terminals 134, 144, although they can be configured as other types of control terminals, such as base terminals.

FIG. 1 to FIG. 4 show cross-sectional views of packages 100 according to exemplary embodiments.

Figure 2:
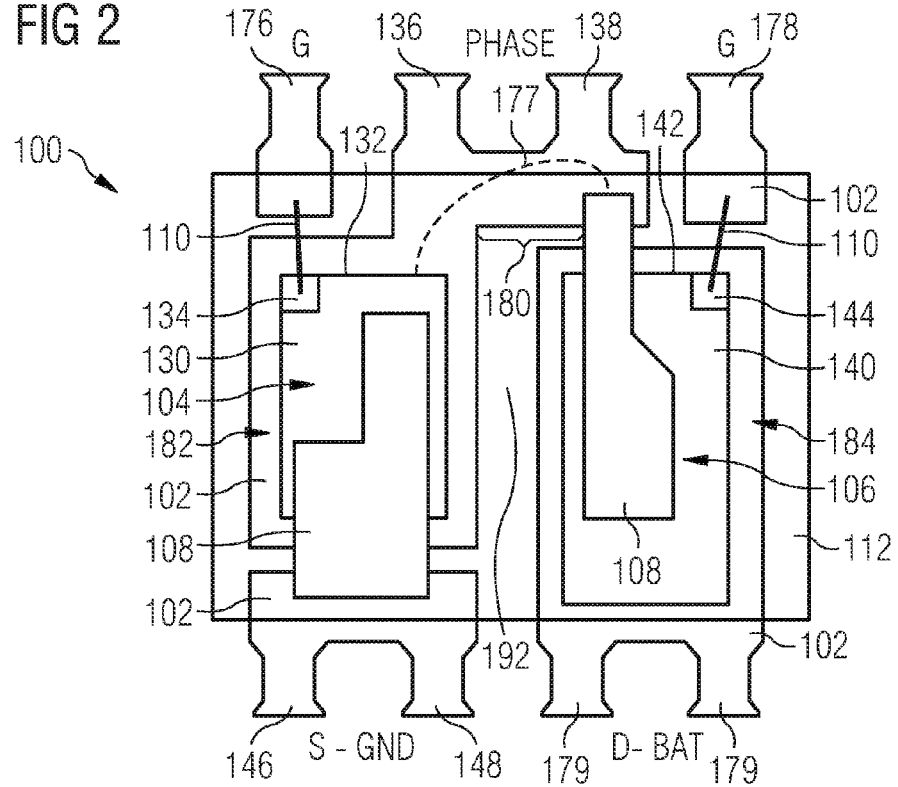

FIG. 1 and FIG. 2 show two embodiments of a package 100 with a half bridge configuration, in which a chip carrier 102 is embodied as a leadframe based on a footprint of a PQFN package design. The embodiment of FIG. 1 offers the opportunity to implement a large die size. The embodiment of FIG. 2 offers an extraordinary high current capability, since two pins 146, 148 are available for current carrying.

FIG. 3 and FIG. 4 show two embodiments based on an HSOF footprint or package design. With the high number of pins provided there, the current can always be carried by two pins.

Referring now to FIG. 1 in detail, package 100 is shown which comprises an electrically conductive chip carrier 102, which is here embodied as a leadframe consisting of copper. As an alternative to copper, also iron can be used as a material for the leadframe-type chip carrier 102.

A first field effect transistor chip 104 (more specifically a MOSFET, i.e. metal oxide semiconductor field effect transistor, chip) is mounted on the chip carrier 102 and comprises on an upper side a source terminal 130, on a lower side a drain terminal 132 and on the upper side a gate terminal 134. A separate second field effect transistor chip 106 (here also embodied as a MOSFET chip) is also mounted on the chip carrier 102 and comprises on an upper side a source terminal 140, on an lower side a drain terminal 142 and on the upper side a gate terminal 144. As can be taken from FIG. 1, the first transistor chip 104 and the second transistor chip 106 are arranged on two separate islands (see reference numerals 182, 184) of the chip carrier 102. The islands, mutually electrically isolated from one another, are only connected by the chip carrier 102 and one of clips 108.

The first field effect transistor chip 104 and the second field effect transistor chip 106 are electrically interconnected with one another to form a half bridge circuit. In terms of this half bridge arrangement, the first field effect transistor chip 104 is configured as a low-side switch and the second field effect transistor chip 106 is configured as a high-side switch.

Advantageously, the drain terminal 132 of the first field effect transistor chip 104 is electrically coupled with the source terminal 140 of the second field effect transistor chip 106 by or via the chip carrier 102 and additionally by a clip 108 or another electric connection element. The coupling via the chip carrier 102 is accomplished by a bar section 180 of the chip carrier 102 extending between an exterior edge region of the first field effect transistor chip 104 and an exterior edge region of the second field effect transistor chip 106. Since the bar section 180 extends along the exterior edge regions rather than between the chips 104, 106, a non-bridged gap 192 remains which laterally spaces the first field effect transistor chip 104 with regard to the second field effect transistor chip 106. As a result, the electrically insulating gap 192 remains between the first field effect transistor chip 104 and the second field effect transistor chip 106. The gap 192 between the first field effect transistor chip 104 and the second field effect transistor chip 106 is free of connection elements, such as clips 108 and bond wires 110.

As can be taken from FIG. 1, the drain terminal 132 of the first field effect transistor chip 104 corresponds to a first pin 136 of the chip carrier 102 which is located directly neighboured (i.e. with no other pin in between) to a second pin 138 of the chip carrier 102 to which the source terminal 140 of the second field effect transistor chip 106 corresponds.

Both the first field effect transistor chip 104 and the second field effect transistor chip 106 are configured for operation with a vertical current flow, i.e. with a current propagation direction perpendicular to the paper plane of FIG. 1. Both the drain terminal 132 of the first field effect transistor chip 104 and the drain terminal 142 of the second field effect transistor chip 106 are electrically connected to the chip carrier 102. The drain terminals 132, 142 which correspond to a lower main surface of the transistor chips 104, 106 are electrically conductively mounted (in particularly electrically conductively glued, soldered or sintered) directly on an upper main surface of the chip carrier 102 (i.e. without any further connection element such as a clip, a bond wire, etc. in between). In contrast to this, the source terminal 130 of the first field effect transistor chip 104, the gate terminal 134 of the first field effect transistor chip 104, the source terminal 140 of the second field effect transistor chip 106, and the gate terminal 144 of the second field effect transistor chip 106 are arranged on an upper main surface of the respective transistor chip 104, 106 and are electrically connected to the chip carrier 102 via electric connection elements 108, 110. The gate terminals 134, 144 are arranged facing away from the mounting surface of the chip carrier 102. Also the two source terminals 130, 140 are arranged facing away from the chip carrier 102. In contrast to this, the two drain terminals 132, 142 are arranged facing the chip carrier 102. Via the electric connection elements 108, 110, the vertical gap between the plane of the terminals 130, 134, 140, 144 on the one hand and the upper main surface of the chip carrier 102 is bridged. Thus, each of the electric connection elements 108, 110 is configured to electrically connect a respective one of terminals 130, 134, 140, 144 at a top side of one the transistor chips 104, 106 with the chip carrier 102. In other words, the source terminals 130, 140 and the gate terminals 134, 144 are located on a surface of the field effect transistor chips 104, 106 facing away from the chip carrier 102 and the drain terminals 132, 142. The latter are located on a surface of the field effect transistor chips 104, 106 facing the chip carrier 102. The drain terminal 132 of the first field effect transistor chip 104 and the source terminal 140 of the second field effect transistor chip 106 are located on different height levels of the package 100.

Advantageously, the first field effect transistor chip 104 and the second field effect transistor chip 106 are substantially identical semiconductor chips in terms of size and shape. This allows to manufacture the package 100 with low effort. According to FIG. 1, the transistor chips 104, 106 can be manufactured as identical dies, thereby obtaining a symmetric configuration. By embodying the transistor chips 104, 106 with same chip area size, a component package 100 with a highly symmetric electrical performance is obtained which can additionally be manufactured with low effort.

An encapsulant 112, in particular a mold compound, is provided for encapsulating part of the chip carrier 102, the entire first field effect transistor chip 104 and the entire second field effect transistor chip 106.

In the embodiment according to FIG. 1, additional pins of the leadframe-type chip carrier 102 are shown. The source terminal 130 arranged on a top side of the first field effect transistor chip 104 is connected via a clip 108 as connection element with a source pin 170 of the chip carrier 102. The drain terminal 132 arranged on a bottom surface of the first field effect transistor chip 104 is directly mounted (for instance soldered or sintered) on the leadframe-type chip carrier 102 and is therefore electrically connected to the mentioned first pin 136 as well as with further phase pin 172. The gate terminal 134 of the first field effect transistor chip 104 is arranged on a top surface thereof and is connected with a further connection element, here embodied as bond wire 110, with a gate pin 176. Pins 179 denoted with "BAT" indicate a battery connection.

The source terminal 140 of the second field effect transistor chip 106 is arranged on a top surface of the latter mentioned chip and is electrically connected via yet another connection element, here also embodied as further clip 108, with the second pin 138. The drain terminal 142 of the second field effect transistor chip 106 is arranged on a lower main surface of the second field effect transistor chip 106 and is directly bonded on the leadframe-type chip carrier 102 by a solder or sinter connection. The gate terminal 144 of the second field effect transistor chip 106 is connected with still another connection element, here embodied as further bond wire 110, with a further gate pin 178 of the chip carrier 102. Thus, some of the electric connection elements 108, 110 are embodied as clips 108, other ones of the electric connection elements 108, 110 are embodied as bond wires 110.

In the shown embodiment, the chip carrier 102 comprises the above mentioned bar section 180 extending between and perpendicular to the first pin 136 and the second pin 138 to thereby short-circuit the drain terminal 132 of the first transistor chip 104 with the source terminal 140 of the second transistor chip 106. Highly advantageously, the bar section 180 of the chip carrier 102 extends from island or mounting section 182 of the chip carrier 102 carrying the first field effect transistor chip 104 towards clip 108 above the other island or mounting section 184 of the chip carrier 102 on which the second field effect transistor chip 106 is mounted. This results in a compact design and short electric connection path (illustrated schematically as dotted line 177 in FIG. 1). As can be taken from FIG. 1, a high chip accommodation area can be achieved, compare mounting sections 182, 184.

Referring to a preferred embodiment shown in FIG. 2, the source terminal 130 is assigned to two pins 146, 148 of the chip carrier 102, thereby allowing to obtain a high current carrying capability. More specifically, the clip 108 electrically connecting the source terminal 130 with the chip carrier 102 is directly connected to both pins 146, 148 of the chip carrier. To further promote the current carrying capability in this region and to render the current flow homogeneous, the mentioned clip 108 is broadened at a clip end facing the pins 146, 148. Thus, the embodiment according to FIG. 2 differs from the embodiment according to FIG. 1 in that the embodiment of FIG. 2 comprises two source pins 146, 148 rather than one source pin 170 as available according to FIG. 1. Therefore, a higher current can be handled with the embodiment according to FIG. 2. The provision of multiple source pins 146, 148 on the low-side first field effect transistor chip 104 therefore provides the advantage of a higher current carrying capability of the package 100 as a whole.

Both the embodiments of FIG. 1 and FIG. 2 can for instance be manufactured with a dimension of 5×6 mm$^2$, for instance in a PQFN package architecture.

In contrast to this, the embodiments of FIG. 3 and FIG. 4 relate to another package technology, which can be denoted as HSOF packaging concept. The dimension of the package 100 according to FIG. 3 and FIG. 4 can be 7×8 mm$^2$. As FIG. 2, also the embodiments according to FIG. 3 and FIG. 4 have a high current carrying capability as the result of the provision of two source pins 146, 148 on the low-side transistor chip. Beyond this, as in FIG. 1 and FIG. 2, the cantilever-type bar section 180 of the chip carrier 102 spatially above and functionally between the two field effect transistor chips 104, 106 ensures a short and symmetric current path of the closely connected drain terminal 132 and source terminal 140.

Alternative solutions either require a sophisticated front end technology in form of a source down configuration for the high side MOS which means considerable effort for the technology development. Or they require a flip chip approach on package level, which increases the manufacturing complexity and risk. Since the described embodiments can be formed without these complexity increasing measures, exemplary embodiments provide a simple and efficient layout.

FIG. 5 shows a cross-sectional view of an electronic device 150 comprising multiple packages 100 according to an exemplary embodiment. In the shown embodiment, the packages 100 are electrically interconnected to provide an engine control function and are of the type shown in FIG. 2. The electronic device 150 may also comprise a common mounting base 152 (such as a printed circuit board) which supports the packages 100. The electronic device 150 shown in FIG. 5 implements three half bridge type packages 100 as described above. It is also possible to accommodate the packages 100 in a common casing. Such a casing may have a hollow accommodation volume or can be a further encapsulant such as a mold compound. The system in package type electronic device 150 according to FIG. 5 therefore allows to provide a complex electronic function and can be handled by a user as a single device and thus in an easy way. The user only has to connect exterior connection pads 190 for connecting the electronic device 150 according to FIG. 5 with an electronic periphery. FIG. 5 is a layout example for the example of a PQFN half bridge. The small circles in the shown printed circuit board (PCB) layout are vias 193 which may be used to connect different metal planes in the board or to enhance the thermal resistance.

FIG. 6 shows a cross-sectional view of an electronic device 150 comprising multiple packages 100 according to another exemplary embodiment. The shown embodiment differs from that shown in FIG. 5 that, according to FIG. 6, the packages 100 are of the type shown in FIG. 1.

Figure 7:
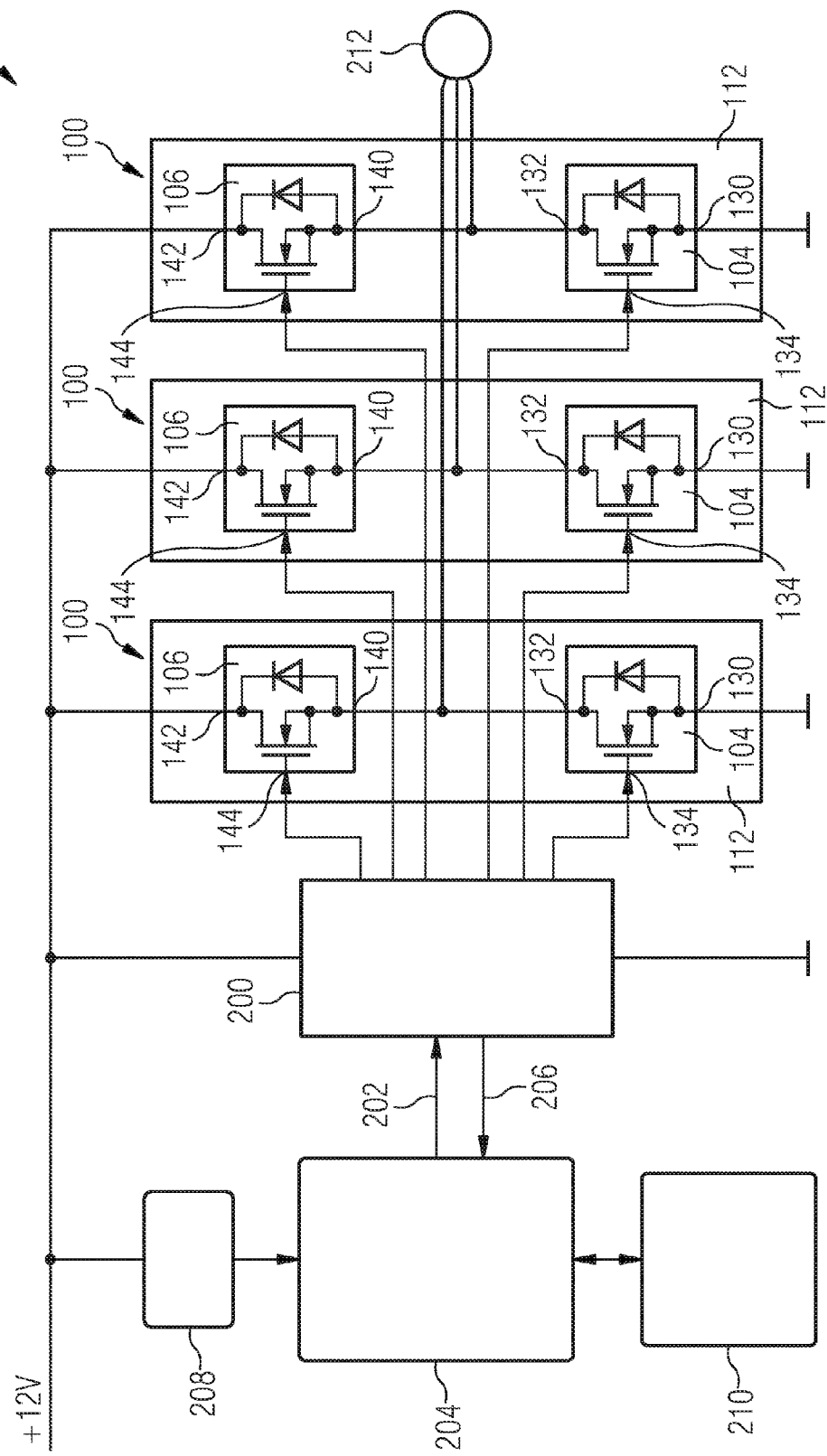
FIG. 7 shows a circuit diagram of an electronic device configured as a three phase motor bridge comprising multiple packages according to an exemplary embodiment.

FIG. 7 shows a circuit diagram of an electronic device 150 configured as a three phase motor bridge comprising multiple packages 100 according to an exemplary embodiment.

FIG. 7 shows a circuit of a three phase motor control. For each phase of a motor 212, a package 100 with half bridge MOS configuration, composed of a high-side MOS (see reference numeral 106) between a supply voltage and phase and a low-side MOS (see reference numeral 104) between phase and ground, is implemented. FIG. 7 hence shows a configuration of a three phase motor bridge with three high-side MOSFET chips connected to a battery and three low-side MOSFET chips connected to ground.

According to FIG. 7, a supply voltage (here +12 V) may be supplied from a battery to the various half bridges realized in form of the three packages 100. The packages 100 may for instance be embodied as shown in FIG. 1 to FIG. 4. Moreover, a driver chip 200 is foreseen which can receive a pulse width modulation (PMW) signal via a connection 202 from a microcontroller 204. The microcontroller 204 may receive a diagnosis signal, via connection 206, from the driver chip 200. Moreover, one or more supply chips 208 may be provided, as well as a transceiver 210 (for instance embodied in accordance with CAN/LIN communication technology).

The three packages 100 shown in FIG. 7 may also be embodied as an electronic device 150 as shown in FIG. 5 or FIG. 6.

FIG. 8 shows a circuit diagram of an electronic device 150 configured as cascaded multiple motor control comprising multiple packages 100 according to an exemplary embodiment.

Thus, FIG. 8 shows a multiple motor control using a cascaded bridge topology as may be used in automotive power seat control or may be used in an automotive heating, ventilation and air conditioning (HVAC) system for flap control. Each motor 212 is operated by two half bridges (which may be denoted as a H-bridge configuration). The left hand side half bridge is unique for all motors 212, whereas there is a separate half bridge for each motor 212 on the right hand side. For low to medium power electric motors 212, the circuitry of FIG. 8 with the packages 100 embodied as shown in FIG. 1 to FIG. 4 is a very efficient solution. FIG. 8 thus shows an example of a cascaded multiple motor control, where the left half bridge is used for all motors 212 together, while each motor 212 has its own half bridge on the right hand side.

The cascaded multiple engine control architecture according to FIG. 8 implements four packages 100, each of which may be embodied as shown and described referring to FIG. 1 to FIG. 4. Three motors 212 or engines can be controlled by the circuit architecture according to FIG. 8.

FIG. 9 shows a cross-sectional view of a leadless package 100 according to an exemplary embodiment.

In the leadless configuration according to FIG. 9, substantially no leads extend beyond the encapsulant 112. Only small connection structures 220 are provided which connect the package 100 with a mounting base 152 such as a printed circuit board (PCB). The connection structures 220 may be connected with pads of the mounting base 152, for instance by soldering or sintering. The field effect transistor chips 104, 106 are embedded within the encapsulant 112 and are therefore not visible according to FIG. 9.

FIG. 10 shows a cross-sectional view of a leaded package 100 according to another exemplary embodiment.

The leaded package 100 according to FIG. 10 differs from the leadless package 100 according to FIG. 9 in that according to FIG. 10 leads 240 of the chip carrier 102 extend beyond the encapsulant 112. The leads 240 serve for electrically contacting the package 100 with the mounting base 152. In the shown embodiment, the exposed leads 240 are configured in a gull wing configuration having some elasticity enabling for a springy equilibration, for instance in the event of thermal loads.

FIG. 11 illustrates schematically a vehicle 160 comprising a power package 100 according to an exemplary embodiment. More specifically, the power package 100 may form part of a control block 162 controlling operation of electric motor/battery block 164. Hence, a package 100 or power module according to an exemplary embodiment may be used for an automotive application.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   an at least partially electrically conductive chip carrier;
   a first transistor chip comprising a first connection terminal, a second connection terminal and a control terminal;
   a second transistor chip comprising a first connection terminal, a second connection terminal and a control terminal;
   wherein the first transistor chip and the second transistor chip are connected to form a half bridge;
   wherein the second connection terminal of the first transistor chip is electrically coupled with the first connection terminal of the second transistor chip by a bar section of the chip carrier extending between an exterior edge region of the first transistor chip and an exterior edge region of the second transistor chip and maintaining a gap laterally spacing the first transistor chip with regard to the second transistor chip.

2. The package according to claim 1, wherein at least one of the first transistor chip and the second transistor chip is configured for operation with a vertical current flow.

3. The package according to claim 1, wherein the first transistor chip is configured as a low-side switch and the second transistor chip is configured as a high-side switch.

4. The package according to claim 1, wherein the second connection terminal of the first transistor chip corresponds to a first pin of the chip carrier which is located directly neighboured to a second pin of the chip carrier to which the first connection terminal of the second transistor chip corresponds.

5. The package according to claim 4, wherein the bar section extends between the first pin and the second pin and/or perpendicular to the first pin and the second pin to thereby short-circuit the second connection terminal of the first transistor chip with the first connection terminal of the second transistor chip.

6. The package according to claim 1, wherein the second connection terminal of the first transistor chip and the first connection terminal of the second transistor chip are located at different height levels of the package.

7. The package according to claim 1, wherein the first transistor chip and the second transistor chip are arranged on two separate islands of the chip carrier.

8. The package according to claim 1, wherein the gap between the first transistor chip and the second transistor chip is free of connection elements.

9. The package according to claim 1, wherein the control terminals are arranged facing away from the chip carrier.

10. The package according to claim 1, wherein two of the connection terminals are arranged facing away from the chip carrier and the other two of the connection terminals are arranged facing the chip carrier.

11. The package according to claim 1, wherein at least one of the second connection terminal of the first transistor chip and the second connection terminal of the second transistor chip is directly electrically connected to the chip carrier.

12. The package according to claim 1, wherein at least one of the first connection terminal of the first transistor chip, the control terminal of the first transistor chip, the first connection terminal of the second transistor chip, and the control terminal of the second transistor chip is electrically connected to the chip carrier via an electric connection element.

13. The package according to claim 1, wherein the first transistor chip and the second transistor chip are substantially identical semiconductor chips.

14. The package according to claim 1, comprising an encapsulant partially encapsulating the chip carrier, and at least partially encapsulating the first transistor chip and the second transistor chip.

15. The package according to claim 1, configured as one of the group consisting of a leaded package, and a leadless package.

16. A package, comprising:
a leadframe-type chip carrier;
a first field effect transistor chip comprising a source terminal, a drain terminal and a gate terminal;
a second field effect transistor chip comprising a source terminal, a drain terminal and a gate terminal;
wherein the drain terminal of the first field effect transistor chip is electrically coupled with the source terminal of the second field effect transistor chip by the chip carrier so that an electrically insulating gap remains between the first field effect transistor chip and the second field effect transistor chip.

17. The package according to claim 16, wherein the first field effect transistor chip and the second field effect transistor chip are connected to form a half bridge.

18. The package according to claim 16, wherein the source terminals and the gate terminals are located on a surface of the field effect transistor chips facing away from the chip carrier, and the drain terminals are located on a surface of the field effect transistor chips facing the chip carrier.

19. The package according to claim 16, wherein at least one of the source terminals is assigned to at least two pins of the chip carrier.

20. An electronic device comprising a plurality of electrically interconnected packages according to claim 1.

21. A method of manufacturing a package, the method comprising:
providing an at least partially electrically conductive chip carrier;
mounting a first transistor chip on the chip carrier, the first transistor chip comprising a first connection terminal, a second connection terminal and a control terminal;
mounting a second transistor chip on the chip carrier, the second transistor chip comprising a first connection terminal, a second connection terminal and a control terminal;
connecting the first transistor chip and the second transistor chip to form a half bridge;
electrically coupling the second connection terminal of the first transistor chip with the first connection terminal of the second transistor chip by a bar section of the chip carrier extending between an exterior edge region of the first transistor chip and an exterior edge region of the second transistor chip and maintaining a gap laterally spacing the first transistor chip with regard to the second transistor chip.

22. A method of manufacturing a package, the method comprising:
providing a leadframe-type chip carrier;
mounting a first field effect transistor chip on the chip carrier, the first field effect transistor chip comprising a source terminal, a drain terminal and a gate terminal;
mounting a second field effect transistor chip on the chip carrier, the second field effect transistor chip comprising a source terminal, a drain terminal and a gate terminal;
electrically coupling the drain terminal of the first field effect transistor chip with the source terminal of the second field effect transistor chip by the chip carrier so that an electrically insulating gap remains between the first field effect transistor chip and the second field effect transistor chip.

23. A method of using a package according to claim 1 for an automotive application, in particular for controlling an electric motor in a vehicle.

* * * * *